US007629667B2

(12) United States Patent  (10) Patent No.: US 7,629,667 B2
Usami  (45) Date of Patent: Dec. 8, 2009

(54) SEMICONDUCTOR DEVICE INCLUDING AN ON-CHIP COIL ANTENNA FORMED ON A DEVICE LAYER WHICH IS FORMED ON AN OXIDE FILM LAYER

(75) Inventor: Mitsuo Usami, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 335 days.

(21) Appl. No.: 10/564,885

(22) PCT Filed: Aug. 28, 2003

(86) PCT No.: PCT/JP03/10935

§ 371 (c)(1),
(2), (4) Date: Jan. 17, 2006

(87) PCT Pub. No.: WO2005/024949

PCT Pub. Date: Mar. 17, 2005

(65) Prior Publication Data

US 2006/0260546 A1   Nov. 23, 2006

(51) Int. Cl.
*H01L 21/8222* (2006.01)
(52) U.S. Cl. .............................. 257/531; 257/E27.009; 257/528; 438/329
(58) Field of Classification Search ................. 257/531, 257/E27.009
See application file for complete search history.

(56) References Cited

U.S. PATENT DOCUMENTS 6,504,227 B1   1/2003   Matsuo et al.

(Continued)

FOREIGN PATENT DOCUMENTS

EP   0977145 A2   2/2000

(Continued)

OTHER PUBLICATIONS

Supplemental European Search Report, EP03818528, dated Sep. 26, 2008.

(Continued)

*Primary Examiner*—Thao X Le
*Assistant Examiner*—Ajay K Arora
(74) *Attorney, Agent, or Firm*—Antonelli, Terry, Stout & Kraus, LLP.

(57) ABSTRACT

An issue of reducing a product manufacture unit cost exists in wireless IC chips which are required to be disposable because the wireless IC chips circulate in a massive scale and require a very high collection cost. It is possible to increase the communication distance of a wireless IC chip with an on-chip antenna simply contrived for reduction of the production unit cost by increasing the size of the antenna mounted on a wireless IC chip or by increasing the output power of a reader as in a conventional way. However, because of the circumstances of the applications used and the read accuracy of the reader, the antenna cannot be mounted on a very small chip in an in-chip antenna form. When an AC magnetic field is applied to an on-chip antenna from outside, eddy current is produced in principle because the semiconductor substrate is conductive. It has been fount that the thickness of the substrate can be used as a design parameter because of the eddy current. Based on this finding, according to the invention, the thickness of the substrate is decreased to reduce or eliminate the energy loss due to the eddy current to utilize the electromagnetic wave energy for the semiconductor circuit operation as originally designed. With the thickness reduction, it is possible to increase the communication distance by preventing ineffective absorption of energy and thereby increasing the current flowing through the on-chip antenna.

8 Claims, 11 Drawing Sheets

U.S. PATENT DOCUMENTS

| | | |
|---|---|---|
| 6,657,542 B2 | 12/2003 | Usami |
| 6,838,773 B2 | 1/2005 | Kikuchi et al. |
| 2001/0012645 A1* | 8/2001 | Usami ................ 438/108 |
| 2001/0038280 A1* | 11/2001 | Aizawa et al. .......... 323/355 |
| 2002/0016020 A1 | 2/2002 | Usami |
| 2002/0074666 A1 | 6/2002 | Usami |
| 2002/0130402 A1 | 9/2002 | Usami |

FOREIGN PATENT DOCUMENTS

| | | |
|---|---|---|
| EP | 1160841 A2 | 12/2001 |
| EP | 1193759 A1 | 4/2002 |
| EP | 1202296 A1 | 5/2002 |
| EP | 1320122 A2 | 6/2003 |
| JP | 06-181289 | 6/1994 |
| JP | 61-81289 | 6/1994 |
| JP | 07-030323 | 1/1995 |
| JP | 3066278 | 11/1999 |
| JP | 2000-163544 | 6/2000 |
| JP | 2000-331830 | 11/2000 |
| JP | 2001-284533 | 10/2001 |
| JP | 2002-337827 | 11/2002 |
| JP | 2003-076961 | 3/2003 |
| JP | 2003-3076961 | 3/2003 |

OTHER PUBLICATIONS

Annex to European Search Report on EP03818528, dated Sep. 26, 2008.

* cited by examiner

FIG.1
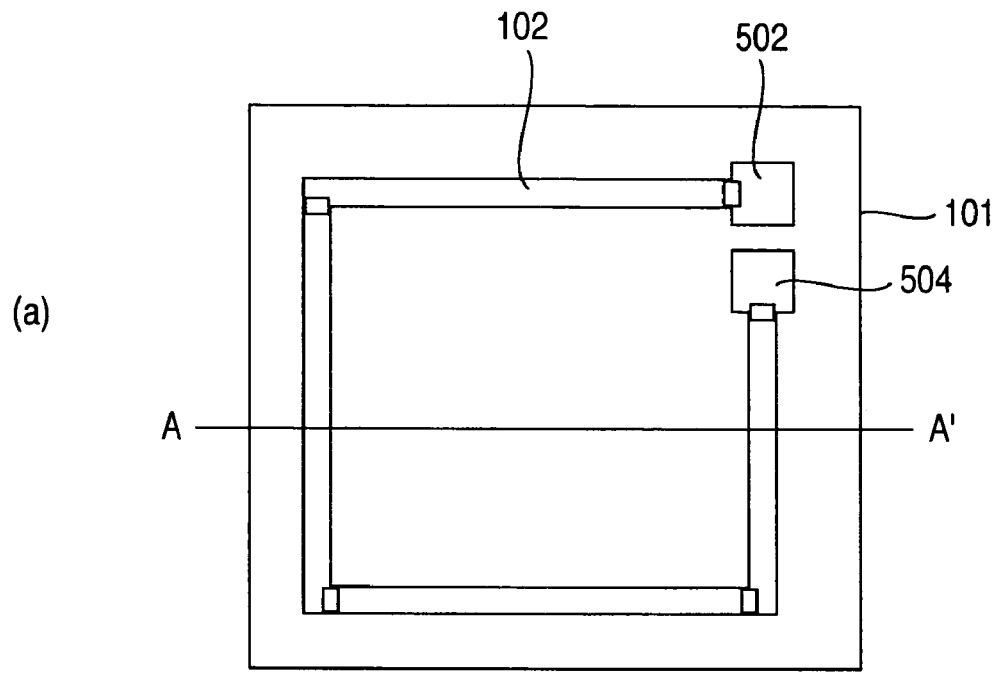
(a)
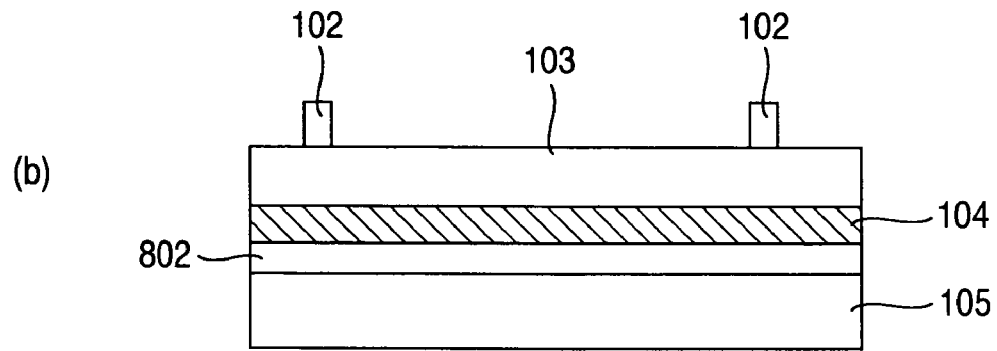
(b)
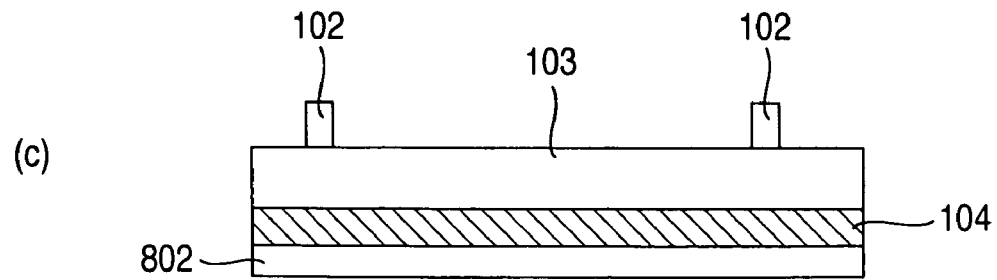
(c)

FIG.9
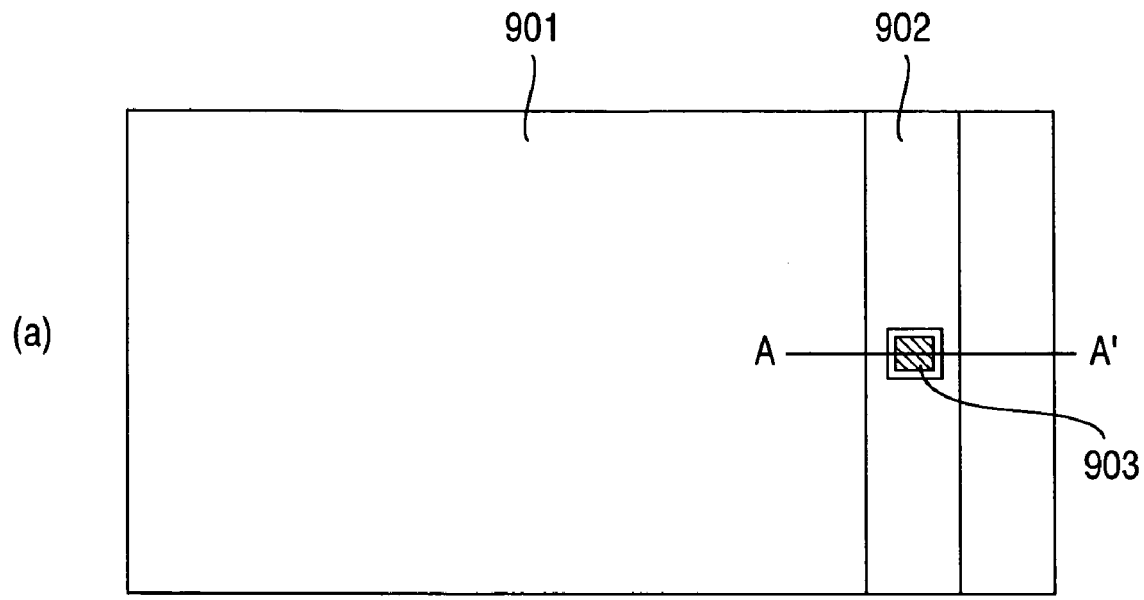
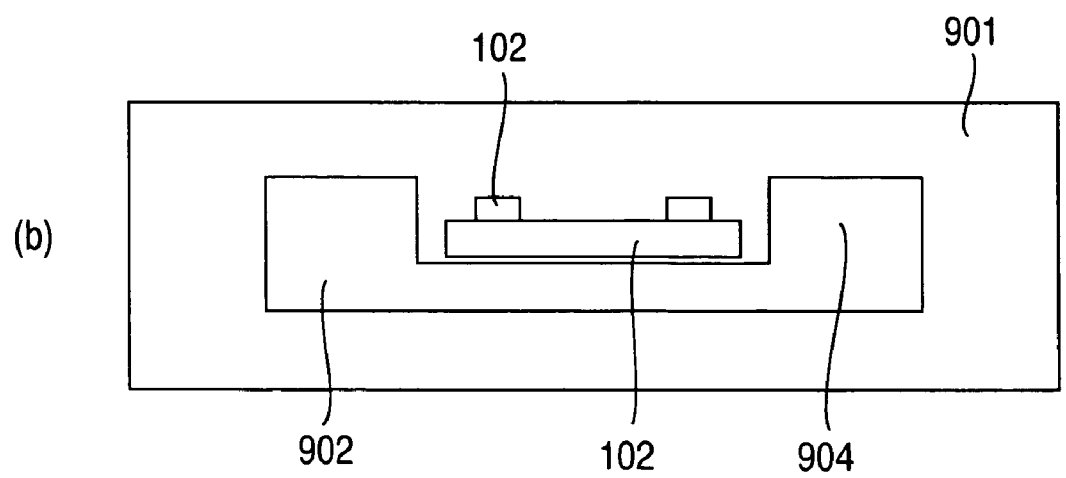

SEMICONDUCTOR DEVICE INCLUDING AN ON-CHIP COIL ANTENNA FORMED ON A DEVICE LAYER WHICH IS FORMED ON AN OXIDE FILM LAYER

TECHNICAL FIELD

The present invention relates to a wireless IC chip for recognition via radio waves.

BACKGROUND ART

Documents referred to in this specification are as follows. Each Document is referred to by using its Document No.
[Document 1] JP-A-7-30323
[Document 2] JP-A-2000-163544
[Document 3] JP-A-2002-83894
[Document 4] JP-A-2002-269520

[Document 1] discloses that a patch antenna upper electrode is formed on the front surface of a semi-insulating compound semiconductor substrate, a first ground metal is formed on the back surface, the first ground metal is partially removed in an area under the upper electrode of the patch antenna, and an external ground metal constituting a second ground metal is disposed in parallel with the semi-insulating compound semiconductor substrate, being spaced by a constant distance from the back surface of the substrate, to thereby allow radio waves having a frequency of 60 GHz or lower to be irradiated even if the compound semiconductor substrate has a thickness of about 150 μm.

[Document 2] discloses that a processor circuit is formed on the front side of a chip and a coil having a magnetic layer is formed on the back side to thereby prevent crosstalk.

[Document 3] discloses that an antennal coil is disposed not to be formed on an analog circuit to thereby prevent deterioration of the communication performance of a semiconductor chip.

It also discloses that in order to thin a non-contact type semiconductor device as a final product, a thickness of a bare chip is set to 300 μm or thinner, and about 50 μm to 150 μm for a thin type card.

[Document 4] discloses that there is a proportional relation between a thickness of a wireless chip connecting an antenna on the front and back of a substrate and a ground serial resistance of a transponder circuit of the wireless chip, and if the ground serial resistance is small, a communication distance becomes long, whereas if the ground serial resistance is large, the communication distance becomes short because a loss resistance of the circuit becomes large.

However, as illustratively shown in [Document 1] to [Document 4], there is no conventional technical document which studies an extension of a communication distance by thinning a substrate.

DISCLOSURE OF THE INVENTION

The brief description of the outline of a typical invention among inventions disclosed in this application is as follows:

A semiconductor device is characterized by comprising: a silicon substrate; an antenna made of gold; an insulating layer; and an integrated circuit formed on a surface of the silicon substrate for processing information to be transmitted/received from the antenna, wherein the antenna, insulating layer and integrated circuit are laminated in this order on the surface of the silicon substrate, a thickness of the semiconductor substrate is set to 200 μm or thinner, and a width and a thickness of the antenna are set to 2.6 μm or more and 10 μm or less.

BRIEF DESCRIPTION OF THE DRAWINGS

FIG. 1 shows a wireless IC chip mounting an antenna and cross sectional views of the IC chip.

FIG. 9 shows diagrams illustrating the structure that a wireless IC chip mounting an antenna is buried in a paper medium.

BEST MODE FOR CARRYING OUT THE INVENTION

Figure 2:
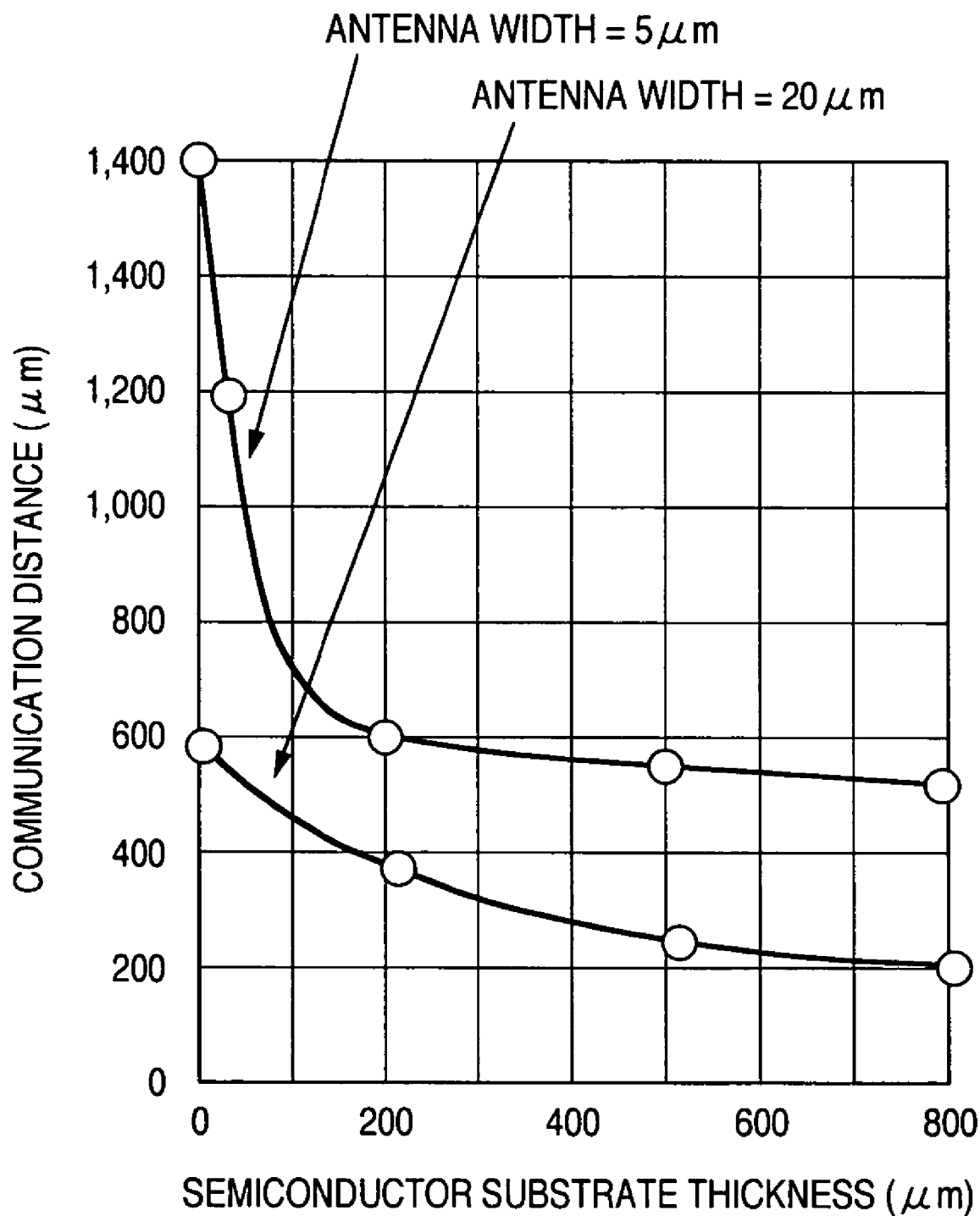
FIG. 2 is a diagram illustrating the advantages obtained by thinning the substrate of a wireless IC chip.

An issue of reducing a product manufacture unit cost exists in wireless IC chips to be used for RFID tags or the like which chips are required to be disposable because wireless IC chips circulate in a massive scale and require a very high collection cost. The issue of reducing a manufacture unit cost can be solved by improving mass productivity by reducing a chip size and increasing the number of chips (RFID tags) capable of being cut from a wafer.

An antenna on chip can be formed by semiconductor processes of manufacturing a wireless IC chip. As compared with a wireless IC chip having an external antenna, the advantages are considerable in terms of reduction in a manufacture unit cost because it is unnecessary to use components for connecting an antenna to terminals and an antenna connection process.

If an antenna is simply formed on a chip and if only conventionally known design parameters such as an antenna size, an antenna width, an antenna resistance value and an output power of a reader apparatus are changed, a practically usable communication distance, which is an important design object, cannot be obtained depending upon application conditions to the used and a read precision of the reader apparatus. The reason that the communication distance cannot be elongated resides in that if the antenna width is made wide, a parasitic capacitance relative to a semiconductor element becomes large and an energy loss appears, the material capable of lowering the antenna resistance value is economically limited and there is an economic lower limit value, and the like. If the size of an antenna mounted on a wireless IC chip is made large, the communication distance can be elongated. However, the large antenna cannot be mounted on a fine chip having a small energy capturing area.

Since a semiconductor substrate is conductive, if an a.c. magnetic field is externally applied to an on-chip antenna, an eddy current is generated principally. Basing upon the finding that a substrate thickness can be used as a design parameter, the present invention aims to thin a substrate thickness in order to eliminate a loss or reduction in an energy to be caused by eddy current. By utilizing the energy of an external a.c. magnetic field for semiconductor circuit operations, absorption of an energy is prevented, reduction in an amount of current flowing through an antenna is prevented, and the communication distance is elongated.

FIG. 1 shows an embodiment of the present invention. FIG. 1(a) is a plan view of the present invention. An on-chip antenna 102 exists on a wireless IC chip 101. FIG. 1(b) is a cross sectional view along A-A' in FIG. 1(a). A resin layer made of polyimide resin or the like is formed on a device layer 104 constituting circuits of the wireless IC chip, and the on-chip antenna made of gold or the like is formed on the resin layer. As electromagnetic waves reach from a reader, eddy current is generated in a semiconductor substrate 105. A spatial energy of radio waves from the reader is dispersed on the substrate side and on the on-chip antenna side to reduce an amount of current flowing through the on-chip antenna 102. Therefore, since the current amount becomes lower than that necessary for operating the wireless IC chip, resulting in shortening a maximum communication distance. It is therefore effective to thin a thickness of the semiconductor substrate. The present inventor has found that in order to reduce eddy current, it is effective to set a thickness of the semiconductor substrate not over 200 μm. An efficiency can be improved if an insulating substrate is used excepting the device layer, because an eddy current can be prevented from being generated.

FIG. 1(c) shows an embodiment in which the semiconductor substrate including the substrate bottom surface is completely removed. This ultimate structure is effective for not generating a wasteful eddy current. A substrate principal surface is a surface on which elements constituting circuits are formed, whereas the substrate bottom surface is a surface opposite to the substrate principal surface. The device layer is a layer formed on the substrate principal surface side and made of elements and wirings constituting circuits.

A substrate thickness is intended to mean a thickness from the substrate bottom surface to the device layer excluding the wiring layer. Namely, the substrate thickness is a thickness from the substrate bottom surface to the layer in which the elements constituting the circuits are formed. A device layer thickness corresponds to the layer in which elements and wirings constituting circuits are formed.

FIG. 2 is a drawing illustrating the advantages of the present invention. Communication distances were measured by irradiating micro waves of 300 mW from a reader to wireless IC chips. The wireless IC chips were formed by depositing polyimide resin having excellent heat resistance and a thickness of 4 μm on the wireless IC chips and by further depositing an on-chip antenna which is formed by gold plating and has a thickness of 10 μm. The on-chip antenna widths were 5 μm and 20 μm. A specific resistance of the silicon substrate was 10 Ωcm.

It can be seen from this measurement data that a communication distance elongates abruptly in the range where the semiconductor substrate thickness does not exceed 200 μm. A communication distance of at least 600 μm can be retained.

At the antenna width of 20 μm, a parasitic capacitance increases between the antenna and semiconductor substrate. An increase in the parasitic capacitance increases a leak of a.c. waves, and the energy is leaked. Even if the thickness of the semiconductor substrate is thinned at the antenna width of 20 μm, the performance changes not so much.

Even in this case, although the effects of elongating the communication distance by thinning the semiconductor substrate are cancelled by the parasitic capacitance, the effects of elongating the communication distance still exist by setting the semiconductor substrate thickness to 200 μm or thinner.

As shown in the graph, under the experiment conditions, a slope of the graph indicating the communication distance relative to the semiconductor substrate thickness becomes steep in the range not over 100 μ, and the communication distance is elongated and can take at least 700 μm.

In the range not exceeding 50 μm in thickness of the semiconductor substrate, a communication performance continues to be improved ultimately, and a communication distance of at least 1000 μm can be retained. This is because the eddy current reduces further.

In the above-described experiments, although the thickness of polyimide resin is set to 4 μm, the polyimide resin may be thickened so that a parasitic capacitance between the antenna and semiconductor substrate can be reduced. It is therefore sufficient if polyimide resin has a thickness of at least 4 μm.

In the above-described experiments, although the reader irradiates micro waves of 300 mW, generally, the micro waves from a reader change in a range of 300 mW±150 mW. It is anticipated that micro waves from a reader have 200 mW.

The structure that the semiconductor substrate thickness is 200 μm or thinner is effective for improving the communication performance because of a small eddy current. At the semiconductor substrate thickness of 200 μm or thicker, the eddy current flows almost steadily, and the relation between the thickness and performance is not so remarkable.

Figure 3:
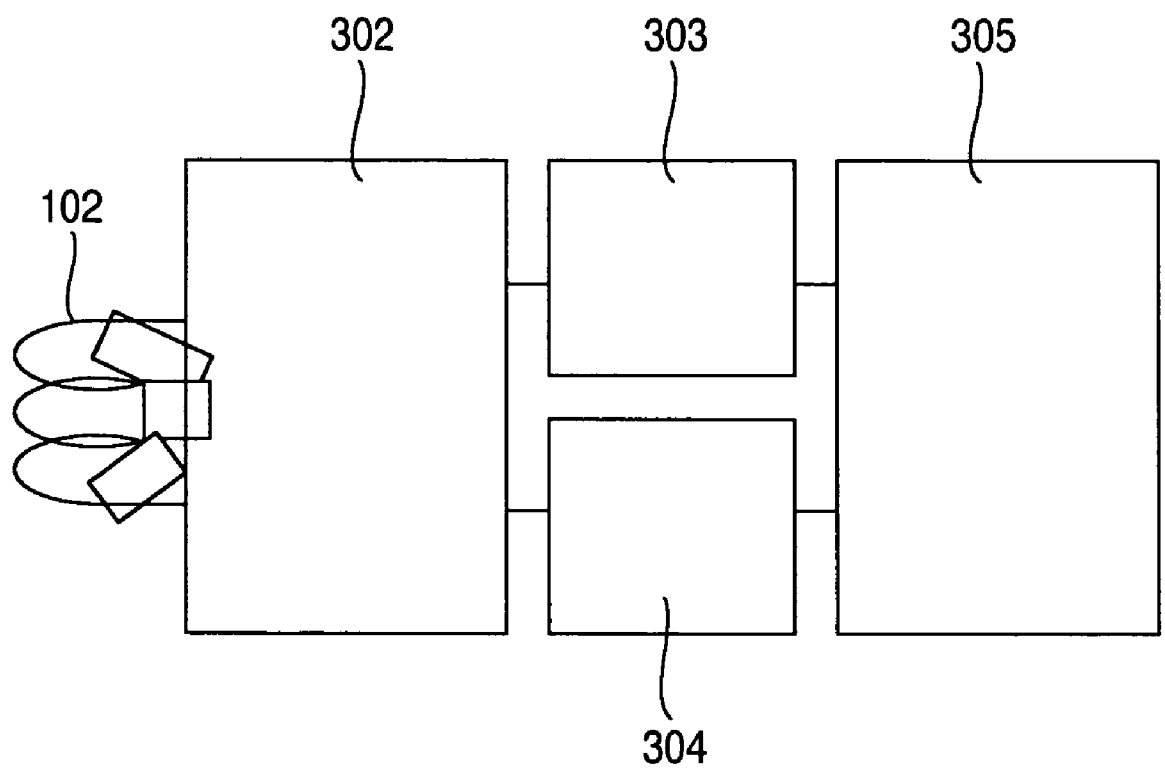
FIG. 3 is a diagram showing a circuit structure of a wireless IC chip.

FIG. 3 shows the structure of the inside of a wireless IC chip according to the present invention. An antenna 102 corresponds to the antenna 102 shown in FIG. 1, and a rectifier circuit 302, a clock extracting circuit 303, a load switch 304 and a counter/memory circuit 305 are formed in the wireless IC chip 101 shown in FIG. 1. The antenna 102 is connected to the rectifier circuit 302. The clock extracting circuit 303 extracts a low frequency clock pulse from a high frequency carrier, and inputs the low frequency clock pulse to the counter/memory circuit 305. An memory output is transmitted to the reader, by changing the impedance relative to the antenna with the load switch 304. The clock extracting circuit extracts a clock width and interval. Since the antenna obtains energy from induction electromagnetic wavers, its shape is often a coil shape. However, the shape is not limited only thereto. In order to improve a Q value of the antenna, it is necessary to reduce inductive coupling between the antenna and device layer and lower the antenna resistance value. To this end, the resin layer is inserted between the antenna and device layer, and it is effective to form the antenna by using the material which is thick (1 to 10 μm or thicker) and has a small resistivity, such as gold plating and copper plating.

Figure 4:
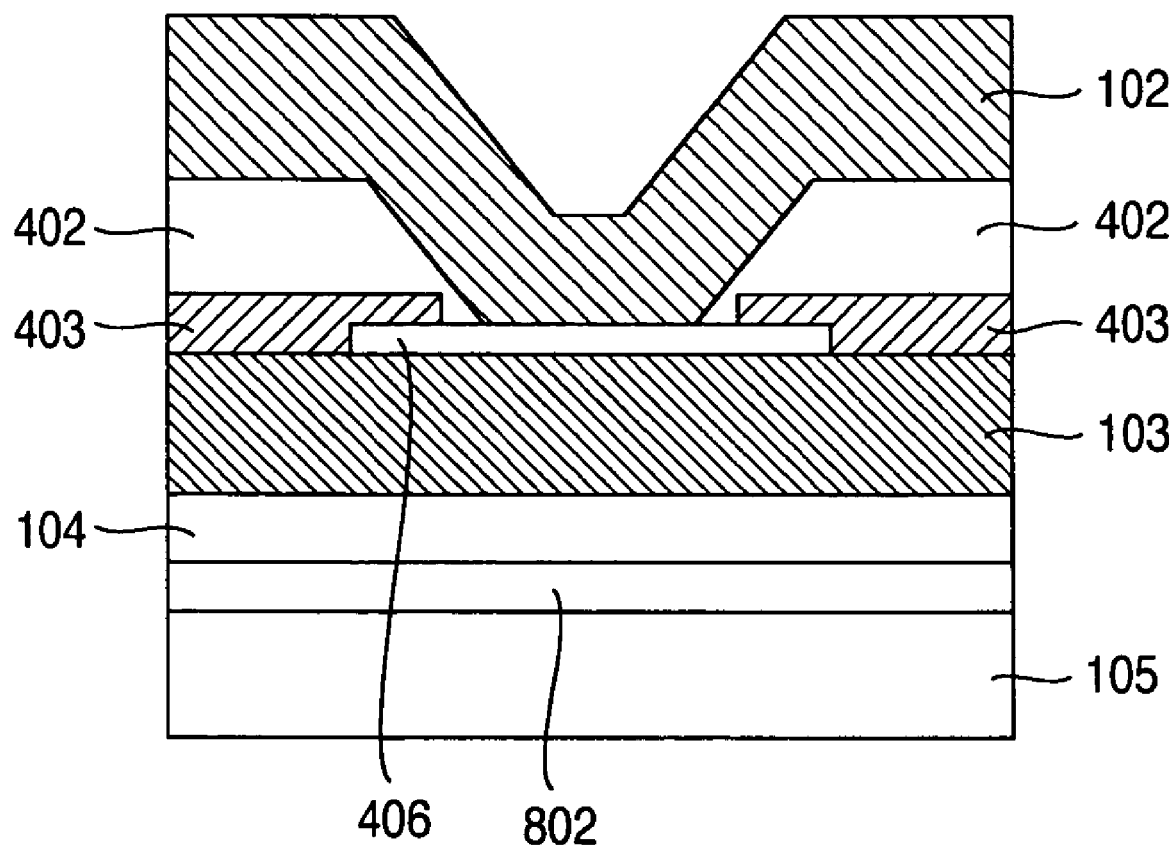
FIG. 4 is a diagram showing the structure that an antenna is made not to be broken by giving a taper to an insulating layer of a wireless IC chip.

FIG. 4 is a cross sectional view showing antenna connection electrodes 502 and 504 shown in FIG. 1. The cross sectional view of FIG. 4 also shows electrodes 502 and 504 shown in FIG. 5 and electrodes 502 and 504 shown in FIG. 7. An antenna 102 shows a cross section of the antenna 102 shown in FIG. 1. In the cross sectional view of FIG. 4, the antenna 102 covers insulating resin 402 and is connected to a connection pad 406 partially covered with an oxide film 403 and formed above semiconductor elements, a wiring layer 103 and a semiconductor substrate 105. As shown in FIG. 4, since the insulating resin is as thick as 4 µm or more, it has a tapered cross sectional shape so that the antenna pattern can be vacuum deposited without breakage.

Figure 5:
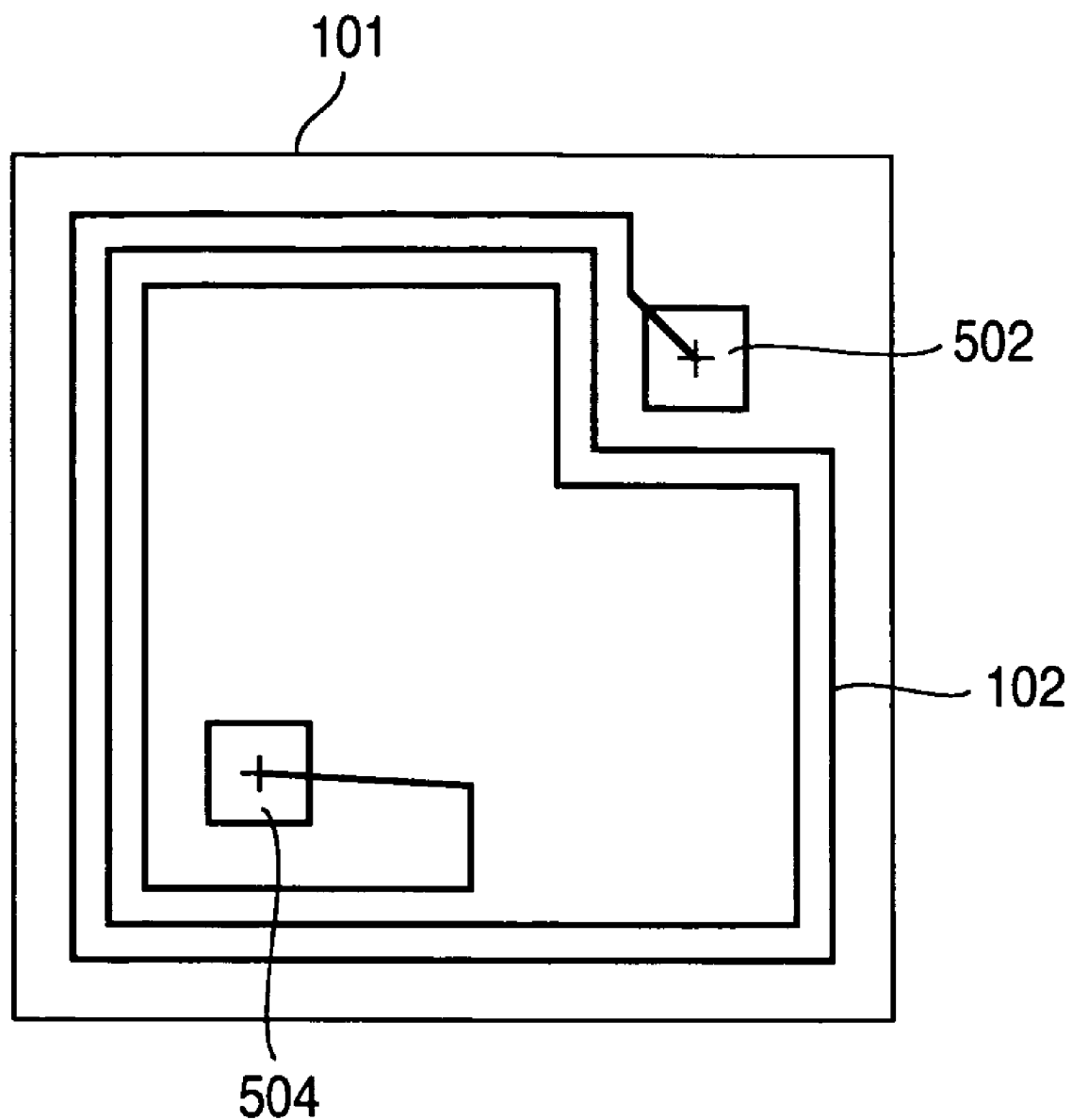
FIG. 5 is a diagram showing the shape of an antenna mounted on a wireless IC chip.

FIG. 5 shows another embodiment of the present invention. The present inventor has found that a width of an antenna 102 formed on a wireless IC chip 101 contributes to the performance. Namely, although the on-chip antenna is connected between electrode terminals 502 and 504 on the wireless IC chip, this structure makes the antenna have a parasitic capacitance relative to the semiconductor substrate, if the insulating film cannot be made thick. Although the parasitic capacitance can be lowered by thickening the insulating film, this results in an increase in a manufacture unit cost. The present inventor has devised the structure of narrowing the width of an on-chip antenna.

Figure 11:
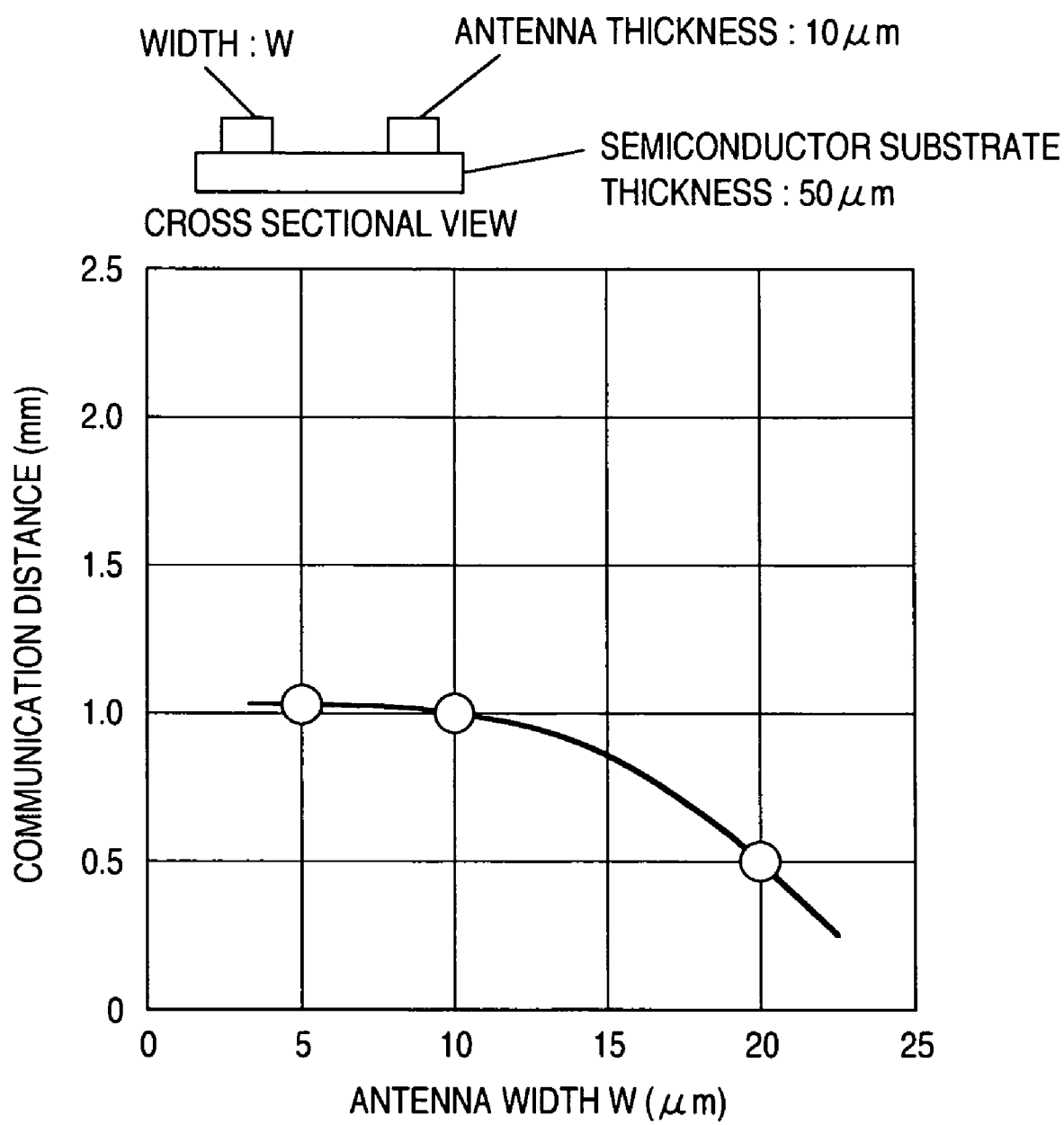
FIG. 11 is a graph showing measured data representative of a relation between a width of an antenna of a wireless IC chip and a communication distance.

FIG. 11 shows measurement data representative of a relation between an antenna width and a communication distance. This measurement data indicates that a communication distance can be retained by setting an antenna width to 10 µm or narrower. An antenna thickness was set to 10 µm. It is sufficient if an antenna thickness is equal to or thicker than that of a high frequency skin depth effect. An antenna thickness is 2.6 µm or thicker assuming that micro waves have a frequency of 2.45 GHz. Namely, if the antenna thickness becomes 2.6 µm or thinner, the communication distance becomes short. Therefore, a communication distance can be retained by setting the antenna width to 2.6 µm or wider and 10 µm or narrower. The antenna width and thickness shown in FIG. 11 may be reversed. Namely, the abscissa of FIG. 11 may represent the antenna thickness, and the antenna width is set to 10 µm, with similar results. The antenna material is desired to have a low resistance and may be gold, copper, silver, aluminum or the like.

Figure 6:
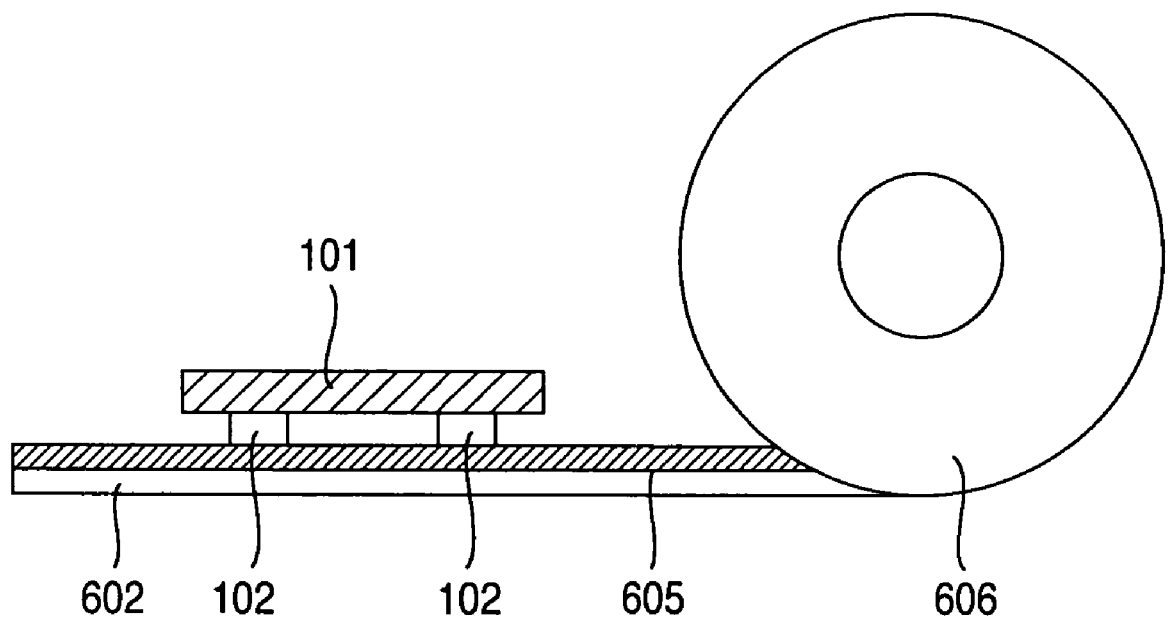
FIG. 6 is a diagram showing the structure that an antenna mounted on a wireless IC chip is protected.

FIG. 6 shows an embodiment in which a wireless IC chip with an on-chip antenna is mounted on a tape in order to make it easy to handle the wireless IC chip with an on-chip antenna shown in FIG. 1. An on-chip antenna 102 on the surface of a wireless IC chip 101 is attached in a face-down direction to a film 602 coated with an adhesive layer 605 and wound around a reel 606. Gold is often used as the material of an on-chip antenna. If a protective film is not attached to the surface of gold, the gold is likely to be damaged, resulting in a low performance. In this embodiment, the adhesive layer of the tape provides both an adhesion effect and a protective effect of the surface of gold antenna. Wireless IC chips wound by the reel are pulled out and cut out when necessary and adhered to objects.

Figure 7:
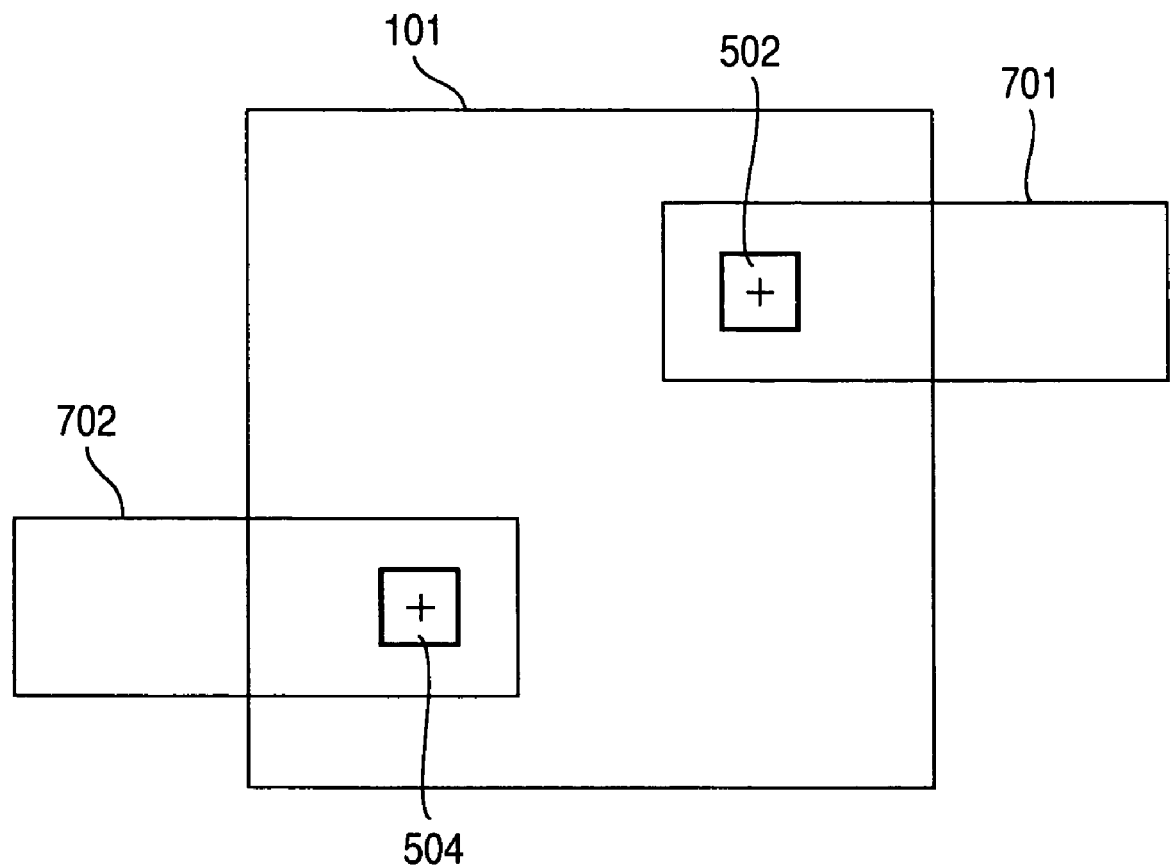
FIG. 7 is a diagram showing that a terminal of an antenna mounted on a wireless IC chip is shared with an external antenna terminal.

FIG. 7 shows an embodiment in which an external antenna of a wireless IC chip is connected by utilizing a chip having the same device layer and electrode portions as those of the wireless IC chip with an on-chip antenna shown in FIG. 1. The electrode terminals 502 and 504 shown in FIG. 5 and described above function also as mount terminals for external radiation antennas 701 and 702. With this arrangement, external antenna terminals and on-chip antenna can be manufactured separately, by using the same processes immediately before the last gold plating process among semiconductor manufacture processes and changing only the mask of the last gold metal plating process.

Figure 8:
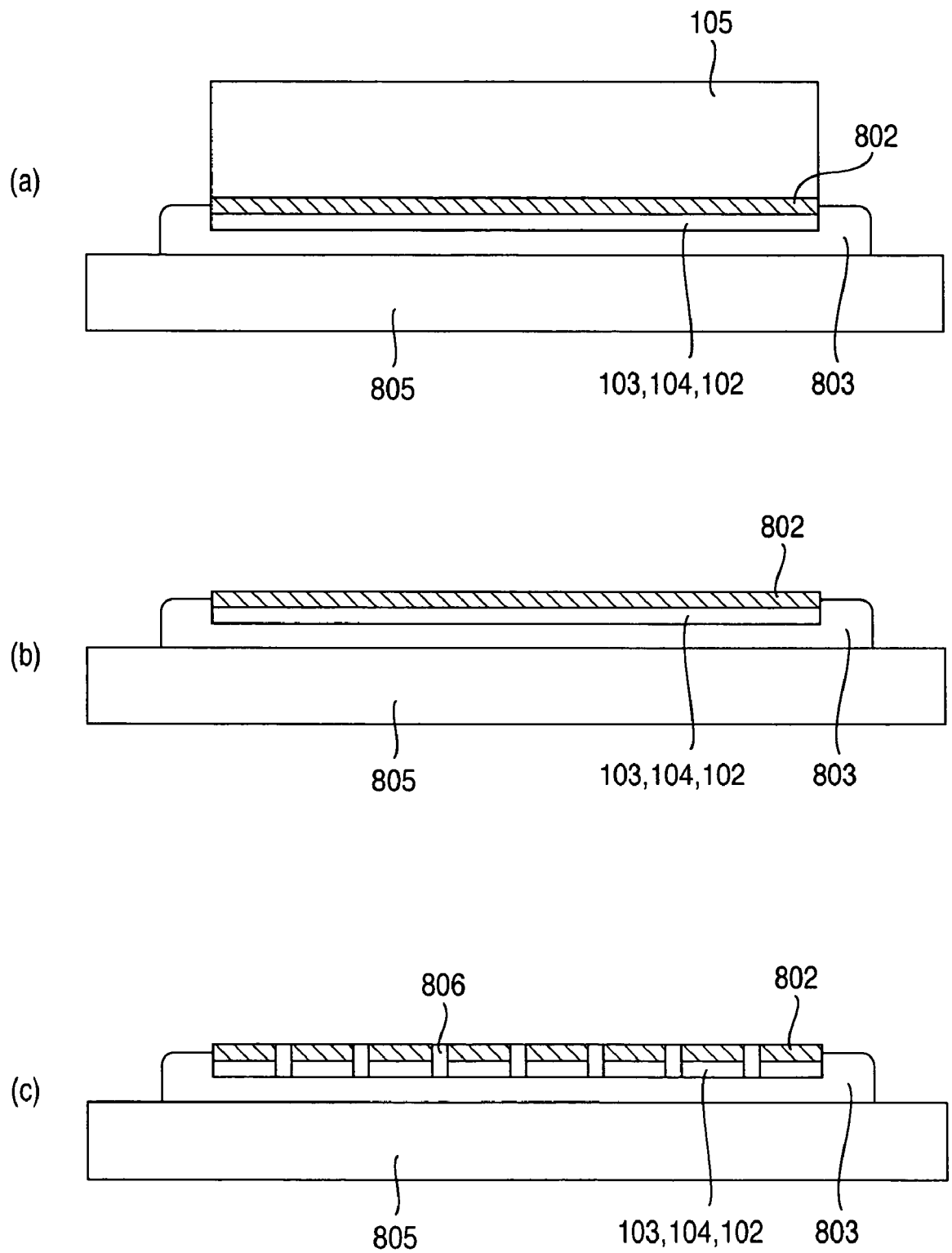
FIG. 8 shows diagrams illustrating a process of thinning a substrate of a wireless IC chip.

FIG. 8 shows another embodiment of the present invention. The embodiment in which the semiconductor substrate is completely removed has been described earlier. A method of realizing this will be described. FIG. 8(a) is a cross sectional view showing a finished wafer with an on-chip antenna constituted of a substrate 105, an oxide film 802 and a layer 804 including an on-chip antenna and semiconductor elements. This wafer is adhered to a substrate 805 such as a glass substrate with adhesive 803. FIG. 8(b) illustrates a next process and is a cross sectional view of the process immediately after the wafer formed in FIG. 8(a) is immersed in solution of potassium hydroxide or the like to remove the silicon on the wafer back surface side. The oxide film in the wafer is not etched with potassium hydroxide so that it has a function of an etching stopper layer. FIG. 8(c) is a cross sectional view of the process immediately after etching grooves 806 are formed by forming a mask pattern on the back surface by photoresist techniques and etching the oxide film 802 and the layer 804 including the on-chip antenna and semiconductor elements, after the process shown in FIG. 8(b).

FIG. 9 shows the structure that a wireless IC chip with an on-chip antenna is buried in securities such as bills. FIG. 9(a) is a plan view of securities 901, and a thread 902 mounting a wireless IC chip 101 is buried in the paper. FIG. 9(b) is a cross sectional view along A-A' in FIG. 9(a). The characteristic point in FIG. 9(b) resides in that a wireless IC chip 101 with an on-chip antenna 102 is formed very thin by the processes shown in FIG. 8 or the like, about 10 µm in thickness for example. If such a thin wireless IC chip is buried in a paper medium, it is difficult to mechanically endure during a paper compression process at a high pressure by calendar processing. In order to avoid this, a recess is formed in the thread and projections 902 and 904 are formed at peripheral sides. With the function of these projections, even if a high pressure is applied to the paper, it is possible to mechanically protect the wireless IC chip. The material of the thread and projections is preferably plastics such ad PET, fiber materials such as paper, or the like. The material not deformed by pressure application is preferable.

Figure 10:
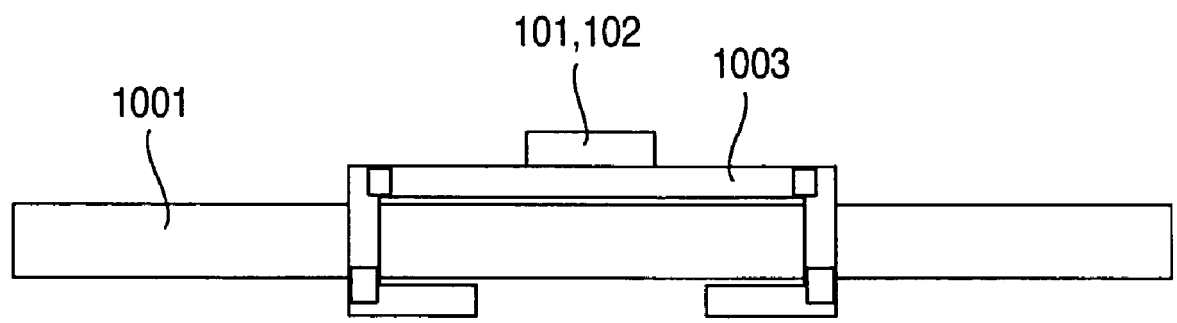
FIG. 10 is a cross sectional view showing a wireless IC chip mounting an antenna bonded to a stapler.

FIG. 10 is a cross sectional view showing the mount state that a wireless IC chip with an on-chip antenna described above is mounted on or inside a stapler. A wireless IC chip 101 and an antenna 102 are mounted on a staple 1003 of a stapler and inserted into a paper or film 1001. Wireless IC chips are mounted beforehand on a train of staples of the stapler in a proper order. This staple train is mounted on the stapler and each staple is attached to a paper or film. Wireless IC chips can be mounted as desired in a manner similar to a conventional stapler. A conventional stapler itself can be used for mounting a wireless IC chip. The advantages of reducing a mount cost of the wireless IC chip can be obtained. In the case in which the stapler is pushed against a document or the like to bend a staple, and the wireless IC chip 101 receives a stress and is broken, it is effective that a groove is formed in the stapler and the wireless IC chip is buried in the groove.

The present invention made by the inventor has been described in connection with the preferred embodiments. The invention is not limited only to the above embodiments. It will be apparent that other various modifications can be made without departing from the gist of the present invention. For example, in the above embodiments, although the present invention is realized by using an SOI substrate, the present invention is not limited to the SOI substrate but a general Si substrate may also be used.

INDUSTRIAL APPLICABILITY

The present invention is applicable to the technical field of RFID which is the background of the present application.

The invention claimed is:
1. A semiconductor device comprising:
a device layer;
an oxide film layer; and
an on-chip coil antenna comprised of gold formed on said device layer;

wherein said device layer and said oxide film layer are laminated in this order from the top to the bottom;
said device layer comprises semiconductor circuits of a wireless IC;
said on-chip coil antenna is configured to receive a microwave of 2.45 GHz;
a thickness of said on-chip coil antenna is set to 2.6 μm or thicker; and
a width of said on-chip coil antenna is set from 2.6 μm to 10 μm.

2. The semiconductor device according to claim 1, further comprising a resin layer formed between said on-chip coil antenna and said device layer,
wherein electrode portions for connecting said on-chip coil antenna and said semiconductor circuits are formed in areas where said resin layer is formed in a tapered shape.

3. The semiconductor device according to claim 1, further comprising a tape coated with an adhesive layer, wherein a side of said on-chip coil antenna of said semiconductor device is adhered to said adhesive layer.

4. A paper sheet comprising:
the semiconductor device recited in claim 1; and
a protective member having a recess,
wherein the semiconductor device is included in said recess of said protective member.

5. A staple of a stapler comprising the semiconductor device defined in claim 1 mounted on a surface or inside the staple of the stapler.

6. A manufacture method for the semiconductor device according to claim 1, characterized by comprising a step of:
etching a wafer which includes the semiconductor device from a rear surface thereof to an oxide film inside the wafer to form separation grooves in the wafer.

7. A semiconductor device comprising:
a device layer;
an oxide film layer; and
an on-chip coil antenna comprised of gold formed on said device layer;
wherein said device layer and said oxide film layer are laminated in this order from the top to the bottom;
said device layer comprises semiconductor circuits of a wireless IC;
said on-chip coil antenna is configured to receive a microwave of 2.45 GHz;
a thickness of said on-chip coil antenna is set to 2.6 μm or thicker; and
a width of said on-chip coil antenna is set from 2.6 μm to 10 μm;
wherein the semiconductor device further includes means for avoiding generation of eddy currents, said means comprising said oxide film layer being formed on a semiconductor substrate, said device layer being formed on said oxide film layer and said semiconductor substrate then being removed so that a lower surface of the oxide film layer is not adjoined to said semiconductor substrate to thereby avoid generation of eddy currents due to said semiconductor substrate.

8. A semiconductor device comprising:
a device layer;
an oxide film layer; and
an on-chip coil antenna comprised of gold formed on said device layer;
wherein said device layer and said oxide film layer are laminated in this order from the top to the bottom;
said device layer comprises semiconductor circuits of a wireless IC;
said on-chip coil antenna is configured to receive a microwave of 2.45 GHz;
a thickness of said on-chip coil antenna is set to 2.6 μm or thicker; and
a width of said on-chip coil antenna is set from 2.6 μm to 10 μm;
wherein said semiconductor device is formed by forming a lower surface of said oxide film layer on a semiconductor substrate, forming said device layer on an upper surface of said oxide film layer and then removing the semiconductor substrate from said lower surface of said oxide film layer.

* * * * *